US005499280A

United States Patent [19]
Wilson et al.

[11] Patent Number: 5,499,280
[45] Date of Patent: Mar. 12, 1996

[54] CLOCK SIGNAL GENERATION

[75] Inventors: Nathaniel B. Wilson, San Diego; Gene H. McAllister, La Mesa, both of Calif.

[73] Assignee: QUALCOMM Incorporated, San Diego, Calif.

[21] Appl. No.: 382,770

[22] Filed: Feb. 2, 1995

[51] Int. Cl.⁶ .................................................. H03K 23/48
[52] U.S. Cl. ............................ 377/108; 377/48; 327/115
[58] Field of Search ...................... 377/48, 108; 327/115, 327/160

[56] References Cited

U.S. PATENT DOCUMENTS

| | | | |
|---|---|---|---|
| 4,573,176 | 2/1986 | Yeager | 377/48 |
| 4,942,595 | 7/1990 | Baca | 377/48 |
| 5,077,764 | 12/1991 | Yamashita | 377/48 |
| 5,365,119 | 11/1994 | Kivari | 327/115 |
| 5,371,772 | 12/1994 | Al-Khairi | 327/115 |
| 5,390,223 | 2/1995 | Lindholm | 327/115 |

*Primary Examiner*—John S. Heyman
*Attorney, Agent, or Firm*—Russell B. Miller; Roger W. Martin

[57] ABSTRACT

The clock signal generator of the present invention divides a higher frequency clock down to a frequency that is an uneven sub-multiple of the higher frequency. The input clock to be divided down clocks an 11-bit counter (105–110) that outputs an overflow signal to a D flip-flop (125). The D flip-flop generates a load signal that resets the counter after 1025 clock periods. The load signal also suppresses, after 1025 clock periods, the toggling of another toggle flip-flop (120) that provides a divide by two clock. By suppressing a clock pulse in the divide by two clock, every 1025 clock pulses of the higher frequency clock, the average clock frequency of the divide by two clock is reduced to an uneven sub-multiple of the higher clock frequency.

12 Claims, 3 Drawing Sheets

| CLOCK OSCILLATOR FREQ. | M/N FOR 9.8304 MHz |
|---|---|
| 9.84 MHz (2 x 4.92 MHz) | 1/1 |
| 14.76 MHz (3 x 4.92 MHz) | 2/3 |
| 19.68 MHz (4 x 4.92 MHz) | 1/2 |
| 24.6 MHz (5 x 4.92 MHz) | 2/5 |
| 29.52 MHz (6 x 4.92 MHz) | 1/3 |

5,499,280

CLOCK SIGNAL GENERATION

BACKGROUND OF THE INVENTION

1. Field of the Invention

The present invention relates to clock signals. More particularly, the present invention relates to the generation of a clock signal.

2. Description of the Related Art

Cellular radiotelephones are rapidly decreasing in size and cost. In order to accomplish these reductions, the number of parts contained in a radiotelephone are reduced. This reduces the cost of the total number of radiotelephone parts, the manufacturing costs and also reduces the weight of the unit. In order to continue these reductions in cost and weight, the radiotelephone parts count must be reduced further.

Radiotelephones require multiple clock frequencies to operate due to the different requirements of circuits within the radiotelephone. For example, a microprocessor may use a different clock than the RF circuits. Some of these clock frequencies are obtained by dividing one clock signal into sub-multiples of that frequency. This technique reduces the number of oscillators needed to generate the various clock signals.

In a code division multiple access radiotelephone, a master clock frequency of eight times the chip rate of 1.2288 MHz is used for various digital circuits. For cellular use, this frequency, 9.8304 MHz, or its double of 19.6608 MHz, are not suitable master frequencies for the RF components of the radiotelephone since neither is an even multiple of the 30 kHz RF channel spacing required for cellular radio in the United States.

In this case, multiple oscillators are needed to generate the different clock signals required by both the digital hardware and the RF circuitry. There is a resulting need for a clock generator that can produce a clock frequency that is an uneven multiple of another frequency, thus reducing the number of clock synthesizers required.

SUMMARY OF THE INVENTION

The clock generator of the present invention generates a clock signal having a frequency that is an uneven sub-multiple of a higher frequency input clock signal. The clock generator is comprised of a counter that is clocked by the input clock signal. The counter generates a count overflow indication in response to a predetermined number of input clock signal pulses. A data latch is coupled to the count overflow indication. The input clock signal latches the count overflow indication into the data latch, thus generating a load signal. A toggle flip-flop is coupled to the input clock signal and the load signal. The toggle flip-flop divides down the input clock signal to a lower frequency while the load signal adjusts this lower frequency to the frequency that is an uneven submultiple of the frequency of the input clock signal.

DETAILED DESCRIPTION OF THE PREFERRED EMBODIMENT

The clock generator of the present invention divides a higher frequency clock signal down to an uneven multiple, lower frequency clock signal. In the preferred embodiment, the clock generator provides an output to input ratio of $^{512}/1025$. The clock generator thus eliminates the need for an analog synthesizer to generate the lower clock frequency.

Figures 4, 5:
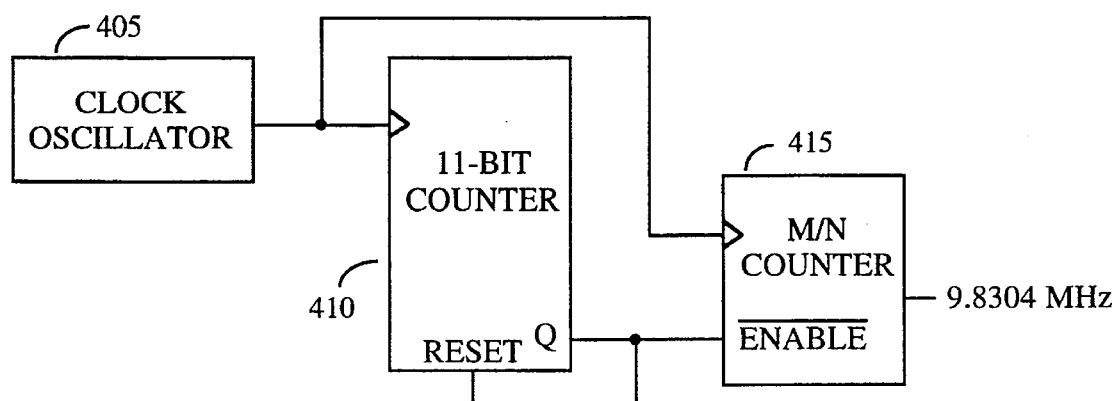
FIG. 4 shows a block diagram of the clock generator of the present invention.
FIG. 5 shows a table of clock oscillator frequencies and divide ratios in accordance with the block diagram of FIG. 4.

The clock generator of the present invention is illustrated in FIG. 4. The clock generator is comprised of a clock oscillator (405) that generates an input clock signal for an 11-bit counter (410) and an $^M/_N$ counter (415). The divide ratio of the $^M/_N$ counter (415) is different for alternate embodiments to accommodate different input clock signal frequencies. The divide ratio is changed by implementing the $^M/_N$ counter (415) in different ways. The 11-bit counter (410) enables and disables the M/N counter (415), thus altering the average frequency of the clock signal output from the $^M/_N$ counter.

In the preferred embodiment, the input clock is a multiple of 4.92 MHz. 19.68 MHz (4×4.92 MHz=656×30 kHz) and 24.6 MHz (5×4.92 MHz =820×25 kHz) are particularly convenient values. In CDMA cellular telephones with a spread spectrum chip rate of 1.2288 MHz, this selection of the input clock is especially advantageous.

An input clock that is an even multiple of 30 kHz is required for the RF phase locked loop synthesizer in phones for U.S. cellular (or a multiple of 25 kHz for some countries). 4.92 MHz is the closest multiple of 30 kHz that is greater than 4×1.2288 MHz. For this reason, the telephone can use analog to digital converters (ADC) and digital to analog converters (DAC) that are clocked by the generator of the present invention, without a significant performance penalty due to the resulting clock jitter.

For example, for the case of an input clock of 19.68 MHz and a signal bandwidth of 614 kHz being clocked out of a DAC, the clock jitter results in about −25dBc of in-band noise being added to the DAC's output spectrum. However, the out of band noise (at greater than 750 kHz) is down below −40 dBc. Both the in-band and out of band noise is acceptable for spread spectrum cellular. If an input clock such as 19.8 MHz, which is farther from a multiple of 4.92 MHz, was selected to drive the $^M/_N$ counter for the DAC's, the out of band noise that results from the clock jitter would be unacceptably large.

The table of FIG. 5 illustrates some possible clock oscillator frequencies and the respective dividing ratios for the $^M/_N$ counter to generate the desired 9.8304 MHz signal. The preferred embodiment of the clock generator uses a 19.68 MHz clock frequency with a dividing ratio of ½.

Figure 1:
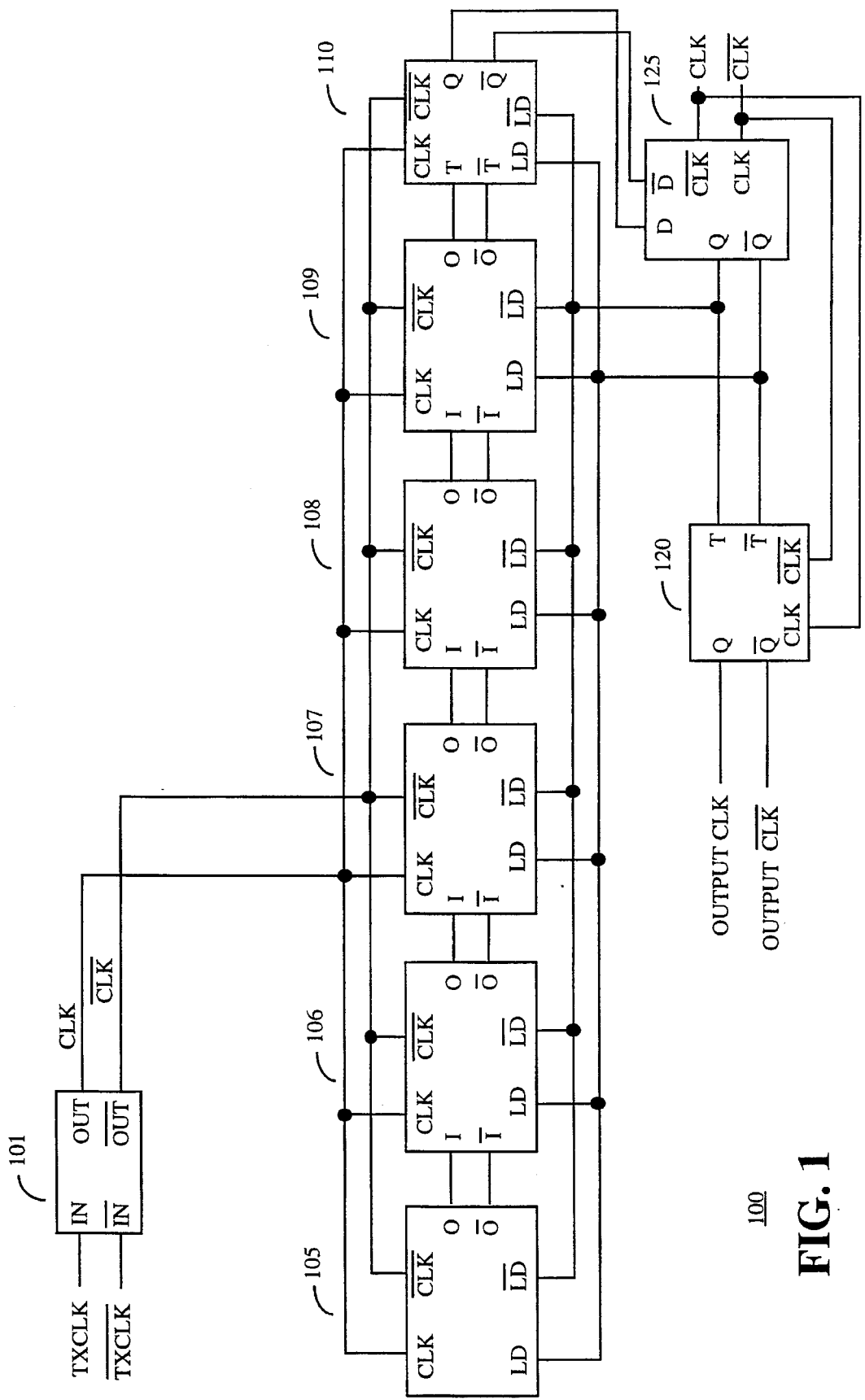
FIG. 1 shows a circuit diagram of the preferred embodiment of the clock generator of the present invention.

The preferred embodiment of the clock generator of the present invention is illustrated in FIG. 1. This embodiment is comprised of five 2-bit counters (105–109) and a 1-bit counter (110) connected in a 6 stage configuration. These counters taken together form the 11-bit counter (410) of FIG. 4. In the preferred embodiment, the 1-bit counter (110) is a toggle flip-flop.

The counters each have count overflow outputs that become true when the counter overflows from the logical "11" state. In the preferred embodiment, each counter has both a count overflow output and an inverse count overflow output.

The count overflow output and the inverse count overflow output of one stage (105) are coupled to the count input and inverse count input, respectively, of the next counter stage (106). These outputs cause the clock pulse count to ripple through the 5 counters. The count overflow output and inverse count overflow output of the last 2-bit counter stage (109) is input to the toggle and inverse toggle inputs of the flip-flop (110) configured to operate as a 1-bit counter.

The input clock signal, from the clock oscillator, is input to a clock driver (101) that increases the drive current of the clock. The clock driver (101) increases the number of gates that the clock signal can drive. In the preferred embodiment, the clock signal is comprised of a clock and an inverse clock.

The counters (105–110) are clocked by the clock signal from the clock driver (101). The clock and the inverse clock are input to the counters respective clock and inverse clock inputs. In the preferred embodiment, the counters (105–110) increment on the rising edge of the clock pulse and the falling edge of the inverse clock pulse.

The most significant bit from the final stage of the counter (110), goes true on the $1024^{th}$ input clock cycle. This bit is output to a D flip-flop (125) where it is latched in by the inverse input clock signal to generate a latched load signal.

The latched load signal is used to load logical 0's into the counter. This effectively resets the counter to zero so that the count begins from there. The load occurs on the $1025^{th}$ input clock cycle. In the preferred embodiment, the load signal is comprised of a load and inverse load signal.

The output clock signal, 9.8304 MHz in the preferred embodiment, is generated by a divide-by-two toggle flip-flop (120) that serves as the $^M/_N$ counter (415) from FIG. 4. The latched load and inverse load signals are input to the toggle inputs of the flip-flop (120). The clock and inverse clock signals are input to the respective clock inputs of the flip-flop (120). When the latched load signals are false, the toggle flip-flop (120) changes state on the rising edge of the clock signal pulses. This toggling divides the clock signal by 2.

The divide-by-two state exists for 1024 input clock periods, producing 512 output clock pulses. During the $1025^{th}$ input clock period, the load signal disables the toggle input, forcing the flop-flop (120) to hold its current state. The toggle flip-flop (120), therefore, produces 512 clock periods for each 1025 input clock periods.

The output clock does not have a constant cycle time. The long term average frequency (or the average over 512 cycles) is 9.8304 MHz. The resulting jitter is within tolerable limits for the preferred embodiment of a cellular radiotelephone. The divided down clock also benefits from low spectral noise.

Figure 2:
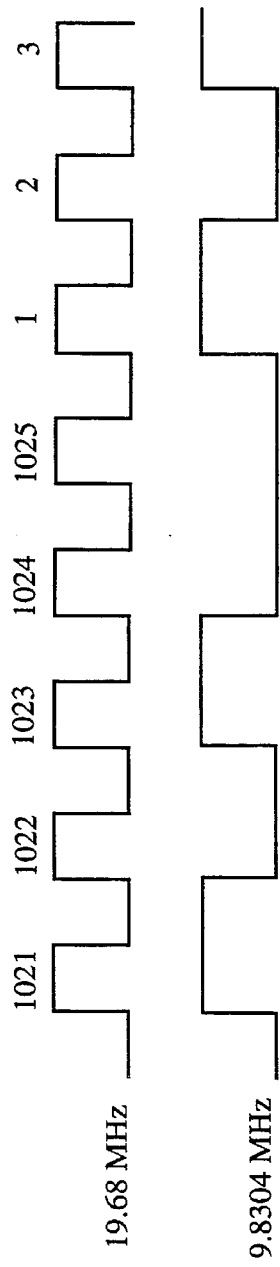
FIG. 2 shows a timing diagram in accordance with the clock generator of FIG. 1.

FIG. 2 illustrates a timing diagram of the higher frequency input clock signal in comparison to the output clock signal. It can be seen that the output clock toggles on the leading edge of each input clock pulse. This continues until the $1025^{th}$ clock pulse where the divide-by-two toggle flip-flop is disabled by the load signal.

Figure 3:
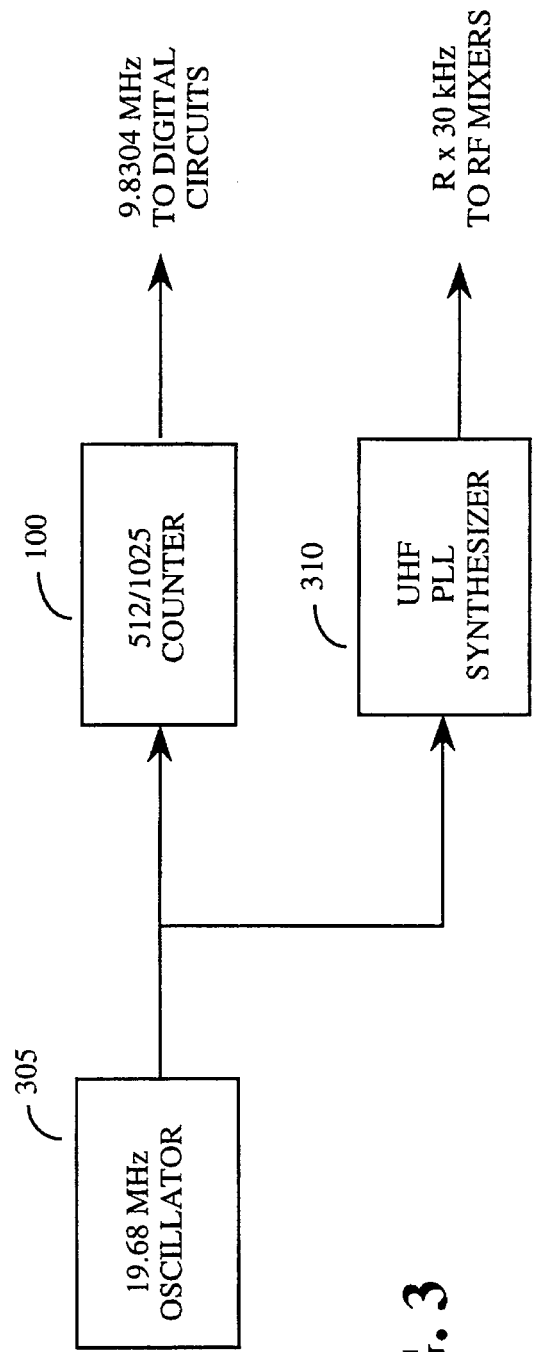
FIG. 3 shows a block diagram of a clock generation circuit incorporating the clock generator of FIG. 1.

FIG. 3 illustrates a typical cellular radiotelephone application for the clock generator of the present invention. This clock generation circuit uses a 19.68 MHz oscillator (305) to generate the input clock signal. The clock generator (100) of the present invention then produces the 9.8304 MHz clock. A phase locked loop synthesizer (310) generates another clock having a higher frequency that is an integer multiple, R, of 30 kHz. This clock, in the preferred embodiment, is used by the RF mixers of the radio.

As is evident from FIG. 5, additional embodiments of the clock generator of the present invention can use different input clock signals to generate the 9.8304 MHz output clock. These alternate embodiments implement the $^M/_N$ counter in different ways to generate the output clock.

A first alternate embodiment generates the output clock signal using an input clock signal of 9.84 MHz (2×4.92 MHz). In this embodiment, the $^M/_N$ counter is an asynchronous clock gating circuit.

A second embodiment generates the output clock signal using an input clock signal having a frequency of 14.76 MHz (3×4.92 MHz). In this embodiment, a 2-bit state machine with asynchronous clock gating is used as the $^M/_N$ counter.

A third embodiment generates the output clock signal using an input clock signal having a frequency of 24.6 MHz (5×4.92 MHz). This embodiment uses a 3-bit state machine as the $^M/_N$ counter.

A fourth embodiment generates the output clock signal using an input clock signal having a frequency of 29.52 MHz (6×4.92 MHz). This embodiment uses a 2-bit state machine as the $^M/_N$ counter.

Other embodiments of the clock generator of the present invention can be implemented using other types of $^M/_N$ counters. The embodiments presented above are only a narrow sampling of such embodiments.

The preferred embodiment of the present invention also uses both a signal and an inverse of the signal. Alternate embodiments may use only the signal, and not the inverse signal, depending on the technology in which the present invention is implemented; i.e., CMOS, bipolar, etc.

As can be seen above, the clock generator of the present invention generates an uneven multiple clock frequency, without additional analog frequency synthesizers, thus saving cost and weight in an electronic device. Without the clock generator of the present invention, additional phase locked loop synthesizers would be required.

We claim:

1. A clock generator for generating an output clock signal having a first frequency from an input clock signal having a second frequency, the first frequency being an uneven submultiple of the second frequency, the clock generator comprising:

a counter having a clock input coupled to the input clock signal and a reset input coupled to a latched load signal, the counter generating a count overflow indication in response to a predetermined number of input clock signal pulses and resetting in response to the latched load signal;

a data latch having an input coupled to the count overflow indication, the data latch generating the latched load signal in response to the input clock signal and the count overflow indication; and a toggle flip-flop having a first input coupled to the input clock signal and a second input coupled to the latched load signal, the toggle flip-flop generating the output clock signal in response to the latched load signal and the input clock signal.

2. The clock generator of claim 1 wherein said counter further comprises:

a plurality of 2-bit counters each having an input coupled to the input clock signal, the plurality of 2-bit counters each generating a 2-bit count overflow indication, each 2-bit count overflow indication being coupled to a next stage 2-bit counter of the plurality of 2-bit counters, a final stage 2-bit counter of the plurality of 2-bit counters generating a final stage 2-bit count overflow indication; and a 1-bit counter having a first input coupled to the final stage 2-bit count overflow indication and a second input coupled to the input clock signal.

3. The clock generator of claim 2 wherein said data latch is a D flip-flop.

4. A clock generator for generating an output clock signal having a first frequency from an input clock signal having a second frequency, the first frequency being an uneven sub-multiple of the second frequency, the clock generator comprising:

a plurality of counters each having a clock input coupled to the input clock signal and each having a reset input coupled to a latched load signal, the plurality of counters each generating a count overflow indication and each resetting in response to the latched load signal, each count overflow indication being coupled to a next stage counter of the plurality of counters, a final stage counter of the plurality of counters generating a predetermined maximum count indication;

a D flip-flop having a first input coupled to the predetermined maximum count indication and a second input coupled to the input clock signal, the D flip-flop generating the latched load signal in response to the predetermined maximum count indication and the input clock signal; and a toggle flip-flop having a first input coupled to the input clock signal and a second input coupled to the latched load signal, the toggle flip-flop generating the output clock signal in response to the latched load signal and the input clock signal.

5. A clock generator for generating an output clock signal having a first frequency from an input clock signal having a second frequency, the first frequency being an uneven sub-multiple of the second frequency, the clock generator comprising:

a plurality of 2-bit counters each having an input coupled to the input clock signal, the plurality of 2-bit counters each generating a count overflow indication, each count overflow indication being coupled to a next stage counter of the plurality of 2-bit counters, a final stage 2-bit counter of the plurality of counters generating a 2-bit count overflow indication;

h first toggle flip-flop having a first input coupled to the 2-bit count overflow indication and a second input coupled to the input clock signal, the first toggle flip-flop generating a predetermined maximum count indication;

a D flip-flop having a first input coupled to the predetermined maximum count indication and a second input coupled to the input clock signal, the D flip-flop generating a latched load signal in response to the predetermined maximum count indication and the input clock signal; and a second toggle flip-flop having a first input coupled to the input clock signal and a second input coupled to the latched load signal, the second toggle flip-flop generating the output clock signal in response to the latched load signal and the input clock signal.

6. A method for generating an output clock signal having a first frequency from an input clock signal having a second frequency in a circuit having a counter, the first frequency being an uneven sub-multiple of the second frequency, the method comprising the steps of:

generating by the counter a maximum count indication after a predetermined number of clock pulses of the input clock signal;

generating a latched load signal in response to the maximum count indication and the input clock signal;

generating the output clock signal, when the latched load signal is false, in response to the input clock signal;

disabling the output clock signal when the latched load signal is true; and resetting the counter when the latched load signal is true.

7. A clock generation circuit for generating a first clock signal having a first frequency and a second clock signal having a second frequency both from an input clock signal having a third frequency, the first frequency being an uneven sub-multiple of the third frequency, the clock generator comprising:

an oscillator for generating the input clock signal having the third frequency of N×4.92 MHz;

a clock generator for generating the first clock signal, the clock generator having an output to input ratio of $(^{1024}/_{1025}) \times (^2/_N)$, the clock generator comprising:

a counter having a clock input coupled to the input clock signal and a reset input coupled to a latched load signal, the counter generating a count overflow indication in response to a predetermined number of input clock signal pulses and resetting in response to the latched load signal;

a data latch having an input coupled to the count overflow indication, the data latch generating the latched load signal in response to the input clock signal and the count overflow indication; and a toggle flip-flop having a first input coupled to the input clock signal and a second input coupled to the latched load signal, the toggle flip-flop generating the output clock signal in response to the latched load signal and the input clock signal; and a phase locked loop synthesizer for generating the second clock signal.

8. The clock generation circuit of claim 7 wherein N is an integer and N≧2.

9. The clock generator of claim 7 wherein said counter further comprises:

a plurality of 2-bit counters each having an input coupled to the input clock signal, the plurality of 2-bit counters each generating a 2-bit count overflow indication, each 2-bit count overflow indication being coupled to a next stage 2-bit counter of the plurality of 2-bit counters, a final stage 2-bit counter of the plurality of 2-bit counters generating a final stage 2-bit count overflow indication; and a 1-bit counter having a first input coupled to the final stage 2-bit count overflow indication and a second input coupled to the input clock signal.

10. The clock generator of claim 9 wherein said data latch is a D flip-flop.

11. A clock generator for generating an output clock signal having a first frequency from an input clock signal having a second frequency, the first frequency being an uneven sub-multiple of the second frequency, the clock generator comprising:

a first counter having a clock input coupled to the input clock signal and a reset input coupled to a count overflow indication, the counter generating the count overflow indication in response to a predetermined number of input clock signal pulses, the first counter being reset by the count overflow indication; and a second counter having a first input coupled to the input clock signal and a second input coupled to the count overflow indication, the second counter generating the output clock signal from the input clock signal and modifying the output clock signal in response to the count overflow indication.

12. The clock generator of claim 11 wherein said first counter further comprises:

a plurality of 2-bit counters each having an input coupled to the input clock signal, the plurality of 2-bit counters each generating a 2-bit count overflow indication, each 2-bit count overflow indication being coupled to a next stage 2-bit counter of the plurality of 2-bit counters, a final stage 2-bit counter of the plurality of 2-bit counters generating a final stage 2-bit count overflow indication; and a 1-bit counter having a first input coupled to the final stage 2-bit count overflow indication and a second input coupled to the input clock signal.

* * * * *